United States Patent
Moens et al.

(10) Patent No.: US 9,515,179 B2
(45) Date of Patent: Dec. 6, 2016

(54) ELECTRONIC DEVICES INCLUDING A III-V TRANSISTOR HAVING A HOMOSTRUCTURE AND A PROCESS OF FORMING THE SAME

(71) Applicant: Semiconductor Components Industries, LLC, Phoenix, AZ (US)

(72) Inventors: Peter Moens, Zottegem (BE); Piet Vanmeerbeek, Sleidinge (BE); John Michael Parsey, Jr., Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/690,703

(22) Filed: Apr. 20, 2015

(65) Prior Publication Data
US 2016/0308045 A1 Oct. 20, 2016

(51) Int. Cl.
| | | |
|---|---|---|
| *H01L 29/00* | (2006.01) | |
| *H01L 29/78* | (2006.01) | |
| *H01L 29/66* | (2006.01) | |
| *H01L 29/20* | (2006.01) | |
| *H01L 29/06* | (2006.01) | |
| *H01L 29/423* | (2006.01) | |
| *H01L 29/08* | (2006.01) | |

(52) U.S. Cl.
CPC ....... *H01L 29/7827* (2013.01); *H01L 29/0603* (2013.01); *H01L 29/0847* (2013.01); *H01L 29/2003* (2013.01); *H01L 29/4236* (2013.01); *H01L 29/66522* (2013.01); *H01L 29/66666* (2013.01)

(58) Field of Classification Search
CPC .......... H01L 29/7827; H01L 29/0603; H01L 29/0847; H01L 29/2003; H01L 29/4236; H01L 29/66522; H01L 29/66666
See application file for complete search history.

(56) References Cited

U.S. PATENT DOCUMENTS

| | | |
|---|---|---|
| 6,566,704 B2 | 5/2003 | Choi et al. |
| 6,740,910 B2 | 5/2004 | Roesner et al. |
| 7,446,025 B2 | 11/2008 | Cohen et al. |
| 7,989,286 B2 | 8/2011 | Cheong et al. |
| 8,637,849 B2 | 1/2014 | Deligianni et al. |

(Continued)

FOREIGN PATENT DOCUMENTS

| | | |
|---|---|---|
| EP | 0951047 A2 | 10/1999 |
| WO | 2010062644 A2 | 6/2010 |
| WO | 2012069606 A2 | 3/2012 |

OTHER PUBLICATIONS

Im, Ki-Sik et al., "First Demonstration of Heterojunction-Free GaN Nanochannel FinFETs," Proceedings of the 25th International Symposium on Power Semiconductor Devices & ICs, Kanazawa, dated 2013, pp. 415-418.

(Continued)

*Primary Examiner* — Nikolay Yushin
(74) *Attorney, Agent, or Firm* — Abel Law Group, LLP

(57) ABSTRACT

An electronic device can include a vertical III-V transistor having a gate electrode and a channel region within a homostructure. The channel region can be disposed between a first portion and a second portion of the gate electrode. In an embodiment, the III-V transistor can be an enhancement-mode GaN transistor, and in a particular embodiment, the drain, source, and channel regions can include the same conductivity type.

19 Claims, 4 Drawing Sheets

(56) References Cited

U.S. PATENT DOCUMENTS

| | | |
|---|---|---|
| 2003/0010971 A1 | 1/2003 | Zhang et al. |
| 2008/0230802 A1 | 9/2008 | Bakkers et al. |
| 2011/0012085 A1 | 1/2011 | Deligianni et al. |
| 2011/0049568 A1 | 3/2011 | Lochtefeld et al. |
| 2013/0240983 A1 | 9/2013 | Larrieu |
| 2014/0084299 A1* | 3/2014 | Schelling .......... H01L 29/42372 257/76 |
| 2014/0191241 A1* | 7/2014 | Edwards ............. H01L 27/098 257/76 |
| 2015/0333122 A1* | 11/2015 | Chan .................. B82Y 10/00 257/329 |

OTHER PUBLICATIONS

Paramanik, Dipak et al., "Formation of Large-Area GaN Nanostructures with Controlled Geometry and Morphology Using Top-Down Fabrication Scheme," Journal of Vacuum Science & Technology B, vol. 30, No. 5, Sep./Oct. 2012, 13 pages.

Dumé, Belle, "Nanowires Give Vertical Transistors a Boost," Technology Update, nanotechweb.org, dated Aug. 2, 2012, <http://nanotechweb.org/cws/article/tech/50424>, 3 pages.

Huang, Yinggang et al., "InAs Nanowires Grown by Metal-Organic Vapor-Phase Epitaxy (MOVPE) Employing PS/PMMA Diblock Copolymer Nanopatterning," Nano Letters, dated 2013, vol. 13, pp. 5979-5984.

* cited by examiner

ELECTRONIC DEVICES INCLUDING A III-V TRANSISTOR HAVING A HOMOSTRUCTURE AND A PROCESS OF FORMING THE SAME

FIELD OF THE DISCLOSURE

The present disclosure relates to electronic devices and processes, and in particular, electronic devices including III-V transistors and processes of forming the same.

RELATED ART

Transistors formed from compound semiconductor materials are becoming more commonplace. GaN transistors can be used in power switching devices. A GaN transistor can be in the form of a planar high-electron-mobility transistor (HEMT) that can form a two-dimensional electron gas (2DEG) at an $Al_{(1-x)}Ga_xN/GaN$ interface, where $0<x<1$. The transistor is normally a depletion mode device. Furthermore, the 2DEG is prone to current collapse during operation. Another design for a GaN transistor is a fin-type field-effect transistor (FinFET) that includes a GaN layer with an $N^+$ nanochannel and an $N^+$ source/drain region. Similar to the HEMT transistor, the typical FinFET is a lateral device and placement of contacts and other metallization may be difficult. A need exists to form a III-V transistor with good on-current, low gate capacitance, and a simpler design for contacts and metallization.

BRIEF DESCRIPTION OF THE DRAWINGS

Embodiments are illustrated by way of example and are not limited in the accompanying figures.

Figure 1:
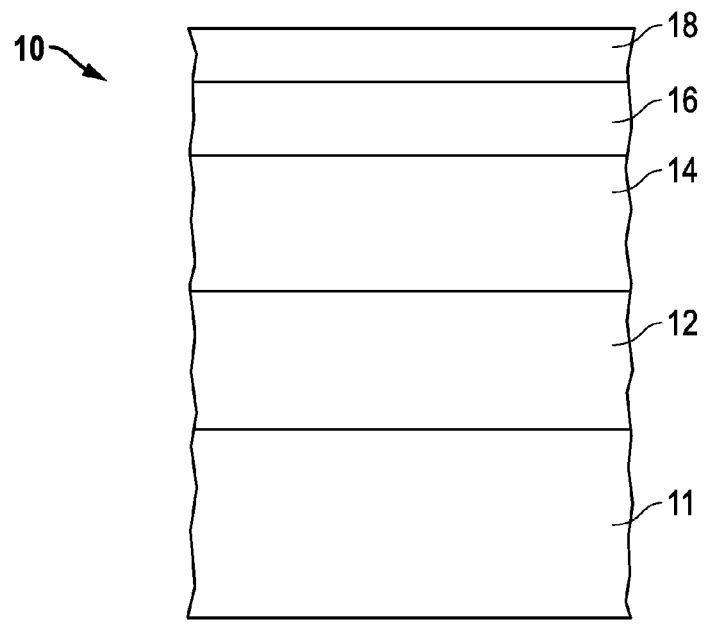
FIG. 1 includes an illustration of a cross-sectional view of a portion of a substrate that includes a substrate and overlying semiconductor layers.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers corresponding to columns within the Periodic Table of Elements based on the IUPAC Periodic Table of Elements, version dated Jan. 21, 2011.

The term "homostructure" is intended to mean a structure that does not include a heterojunction.

The term "metal" or any of its variants is intended to refer to a material that includes an element that is within any of the Groups 1 to 12, and within Groups 13 to 16, an element that is along and below a line defined by atomic numbers 13 (Al), 31 (Ga), 50 (Sn), 51 (Sb), and 52 (Te). Metal does not include Si or Ge.

The term "semiconductor composition" is intended to mean a composition that has an associated bandgap voltage. For example, p-type doped GaN, n-type doped GaN, and intrinsic GaN have the same semiconductor composition, as GaN, and not the dopants, primarily determine the bandgap energy of the materials. GaN and $Al_{(1-x)}Ga_xN$, where $0<x<1$, having different semiconductor compositions they have different bandgap energies.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a vertical III-V transistor having a gate electrode and a channel region within a homostructure. The channel region can be disposed between a first portion and a second portion of the gate electrode. In an embodiment, the III-V transistor can be an enhancement-mode GaN transistor, and in a particular embodiment, the drain, source, and channel regions can include the same conductivity type. The vertical orientation allows a gate electrode to fully deplete a channel region, and thus has good off-state leakage current characteristics. The transistor can have low on-state resistance and low leakage current. The placement of source and drain connections on opposite sides allows for more flexibility in the physical layer and reduce source-to-drain and gate-to-drain capacitive coupling. In a particular embodiment, cavities can be formed between the gate electrode and a heavily-doped drain region to reduce gate-to-drain capacitive coupling. The concepts are better understood in conjunction with particular embodiments as illustrated and described herein that are to exemplify and not limit the scope of the invention as set forth in the appended claims.

FIG. 1 includes an illustration of a cross-sectional view of a portion of a substrate that includes a base material 11, a heavily-doped layer 12, a voltage blocking layer 14, a channel layer 16, and a heavily-doped layer 18. The base material 11 can include a material capable of providing sufficient mechanical support of the overlying layers. The base material 11 can allow the heavily-doped layer 12 to be epitaxially grown from the base material 11. In an embodiment, the base material 11 can include one of more films of monocrystalline silicon, silicon carbide, aluminum nitride, sapphire, aluminum gallium nitride, gallium nitride, another suitable material, or the like. The thickness is not critical as long as it provides sufficient mechanical support. Generally, the thickness is in a range of 50 microns to 5 mm.

The layers 12, 14, 16, and 18 form the active regions of the transistor being formed. In an embodiment, the layers include a III-V semiconductor compound, and in another embodiment, the layers include a III-N semiconductor compound. In a particular embodiment, the layers 12, 14, 16, and 18 have substantially the same semiconductor composition as a homostructure is formed from the layers. Due to variation in manufacturing, the same exact composition may not be possible. Substantially the same semiconductor composition is intended to mean that the more prevalent anion or cation does not vary by more than 5% between all of the layers 12, 14, 16, and 18. In an embodiment, the layers are to be GaN, and may have a composition represented by $Al_{(1-y)}Ga_yN$, wherein $0.95<y<1.00$. In a particular embodiment, all of the layers 12, 14, 16, and 18 have a semiconductor composition of GaN (y=1 for all layers 12, 14, 16, and 18). In another embodiment, the layers can include aluminum gallium nitride; however, the composition of aluminum gallium nitride between the layers 12, 14, 16, and 18 should have an aluminum content and a gallium content that does not vary by more than 5% between all of the layers.

The base material 11 is not part of the active region (current conduction region) of a transistor, and therefore, a heterojunction may or may not be present between the base material 11 and the heavily-doped layer 12.

In an embodiment, all of the layers 12, 14, and 16, and 18 have the same conductivity type. All of the layers 12, 14, 16, and 18 can have an n-type conductivity or a p-type conductivity. Exemplary n-type dopants include Si, Ge, O, and the like, and exemplary p-type dopants include Mg, Ca, C, Zn, Be, Cd, and the like. The heavily-doped layer 12 has a dopant concentration sufficient to allow an ohmic contact to be subsequently made to the heavily-doped layer 12. In the embodiment illustrated in FIG. 1, the heavily-doped layer 12 will be a heavily-doped drain region for the transistor being formed. The dopant concentration can be at least $5\times10^{18}$ atoms/cm$^3$ or at least $1\times10^{19}$ atoms/cm$^3$. The thickness of the heavily-doped layer 12 may be at least 0.5 micron, 1.1 microns, or 2 microns. Although a theoretical upper limit on thickness does not exist for the heavily-doped layer 12, it may be no greater than 9 microns, no greater than 7 microns, or no greater than 5 microns.

The dopant concentration and thickness of the voltage blocking layer 14 may be determined by the operating voltage of the transistor. As the operating voltage increases, the doping concentration may be lowered, the thickness may be increased, or a combination thereof. In an embodiment, the dopant concentration can be at least $5\times10^{15}$ atoms/cm$^3$, at least $1\times10^{16}$ atoms/cm$^3$, or at least $5\times10^{16}$ atoms/cm$^3$, and in another embodiment, the dopant concentration may be no greater than $5\times10^{18}$ atoms/cm$^3$, no greater $1\times10^{18}$ atoms/cm$^3$, or no greater $5\times10^{17}$ atoms/cm$^3$. In an embodiment, the thickness can be at least 0.5 micron, at least 1.1 microns, or at least 2 microns, and in another embodiment, the thickness may be no greater than 50 microns, no greater than 20 microns, or no greater than 9 microns. In a particular embodiment, the voltage blocking layer 14 has a dopant concentration in a range of $5\times10^{16}$ atoms/cm$^3$ to $5\times10^{18}$ atoms/cm$^3$, and a thickness in a range of 1.1 microns to 3 microns.

The channel layer 16 will be used to form channel regions for the transistor being formed. The channel layer 16 may have a dopant concentration lower than each of the layers 12, 14, and 18. The dopant concentration can be at least $1\times10^{13}$ atoms/cm$^3$ or at least $1\times10^{14}$ atoms/cm$^3$, and in another embodiment, the dopant concentration may be no greater than $1\times10^{17}$ atoms/cm$^3$, in another embodiment the doping concentration may be no greater no greater $1\times10^{16}$ atoms/cm$^3$, and in another embodiment the doping concentration may be no greater or no greater $1\times10^{15}$ atoms/cm$^3$. In an embodiment, the thickness can be at least 0.11 micron, at least 0.2 micron, or at least 0.3 micron, and in another embodiment, the thickness may be no greater than 2 microns, no greater than 1.2 microns, or no greater than 0.9 microns. In a particular embodiment, the channel layer 16 has a dopant concentration in a range of $1\times10^{13}$ atoms/cm$^3$ to $1\times10^{15}$ atoms/cm$^3$, and a thickness in a range of 0.11 micron to 0.9 micron.

The heavily-doped layer 18 will be used to form source regions for the transistor being formed. The dopant concentration can be at least $5\times10^{18}$ atoms/cm$^3$ or at least $1\times10^{19}$ atoms/cm$^3$. In an embodiment, the thickness can be at least 0.11 micron, at least 0.2 micron, or at least 0.3 micron, and in another embodiment, the thickness may be no greater than 2 microns, no greater than 1.2 microns, or no greater than 0.9 microns. In a particular embodiment, the heavily-doped layer 18 has a dopant concentration of at least $1\times10^{19}$ atoms/cm$^3$, and a thickness in a range of 0.11 micron to 1.2 microns.

Each of the layers 12, 14, 16, and 18 can be epitaxially grown from its underlying layer. Thus, each of the layers 12, 14, 16, and 18 can be monocrystalline layers with the same semiconductor composition, where only the dopant concentration and thicknesses of the layers vary from one another.

Figure 2:
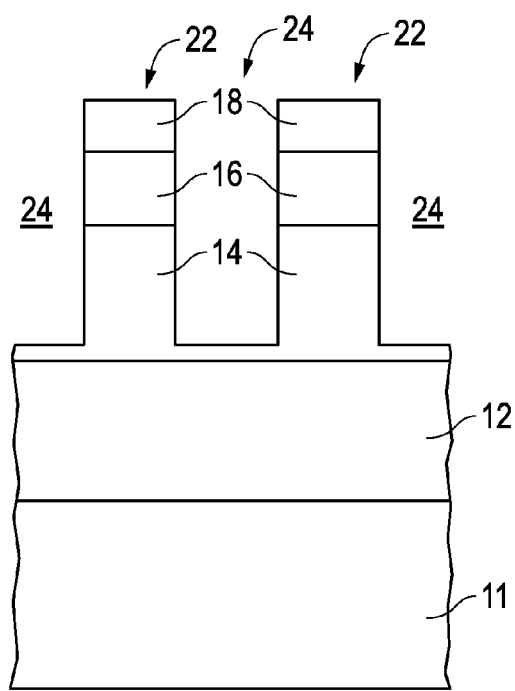
FIG. 2 includes an illustration of a cross-sectional view of the substrate of FIG. 1 after patterning some of the semiconductor layers to form active structures.

In FIG. 2, the layers 14, 16, and 18 are patterned to form active structures 22. A patterned masking layer (not illustrated) can be formed over the heavily-doped layer 18 and define openings where openings 24 are formed by removing portions of the layers 14, 16, and 18. The patterned masking layer protects the portions of the layers 14, 16, and 18 where the active structures 22 are formed. The openings 24 extend through the entire thickness of the heavily-doped layer 18 and the channel layer 16. The openings may extend through at least 50%, at least 65%, or at least 80% of the thickness of the voltage blocking layer 14. In another embodiment (not illustrated), the openings 24 may extend through an entire thickness of the voltage blocking layer 14. The removal can be performed using an anisotropic etchant. The etchant can include a chlorine-containing gas, such as $Cl_2$, HCl, $BCl_3$, or the like. When etching is used, the etching may be performed using a timed etch, endpoint detection, or a combination thereof (endpoint detection with a timed overetch). The patterned masking layer is removed after forming the active structures 22.

In an embodiment, the active structures 22 can have widths of at least 20 nm, at least 40 nm, or at least 60 nm, and in another embodiment, the active structures 22 may have widths no greater than 500 nm, no greater than 300 nm, no greater than 200 nm, or no greater than 150 nm. In a particular embodiment, the widths can be in a range of 60 nm to 120 nm. The shape of the active structures 22 may be similar to islands surrounded by a single opening (not illustrated) or in the form of stripes. The width of the opening is the distance between a pair of active structures 22, whether in the form of islands or stripes. In an embodiment, the openings 24 can have a width of at least 60 nm, at least 70 nm, or at least 80 nm, and in another embodiment, the openings 24 may have widths no greater than 500 nm, no greater than 200 nm, or no greater than 150 nm. In a particular embodiment, the widths can be in a range of 80 nm to 150 nm.

Figure 3:
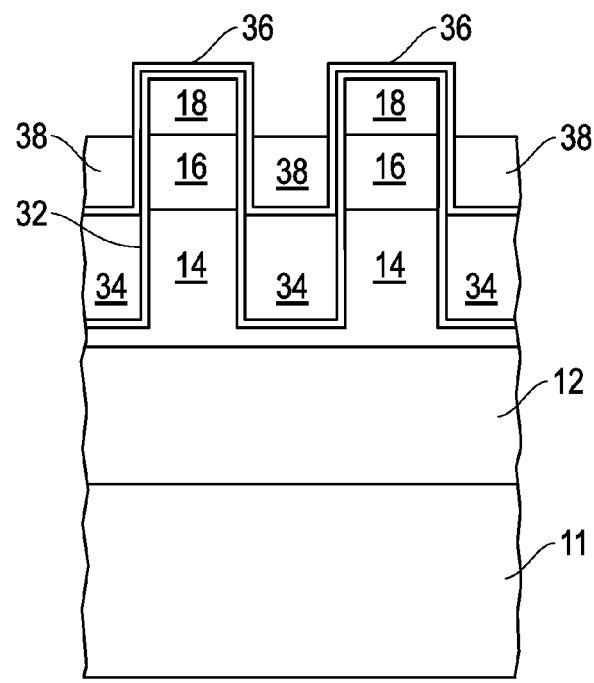
FIG. 3 includes an illustration of a cross-sectional view of the substrate of FIG. 2 after forming a gate dielectric layer, a sacrificial layer, and a gate electrode.

FIG. 3 includes an illustration of the workpiece in FIG. 2 after forming gate dielectric layer 32, a sacrificial layer 34, a gate electrode including a lower conductive film 36, and a bulk conductive film 38. The gate dielectric layer 32 can include one or more oxide films, such as $Al_2O_3$, $TiO_2$, $ZrO_2$, $HfO_2$, $Ta_2O_5$, or the like. The gate dielectric layer 32 can have a thickness in a range of 5 to 100 nm. The gate dielectric layer 32 is formed along all exposed surfaces including walls and bottoms of the openings 24. In an embodiment, the gate dielectric layer 32 is formed using atomic layer deposition. In another embodiment, a chemical vapor deposition may be used, or similar deposition methods.

The sacrificial layer 34 is formed and later removed selectively to other layers that are exposed at a later step. In an embodiment, the sacrificial layer 34 includes silicon, such as undoped polysilicon. The sacrificial layer 34 is formed within the openings 24 and recessed to an elevation no higher than the interface between the voltage blocking layer 14 and the channel layer 16. In another embodiment, the sacrificial layer 34 can be replaced by an insulating layer that is not subsequently removed.

The gate electrode includes the lower conductive film 36 and the bulk conductive film 38. In an embodiment, the lower conductive film 36 can include W, Pt, Ir, Os, Au, a Group 2 element, a rare earth element (that is, Sc, Y, La, or a Lanthanide), or the like. The lower conductive film 36 can have a thickness of at least 5 nm to 100 nm and may be formed by physical or chemical vapor deposition or atomic layer deposition. The bulk conductive film 38 can include a material that is relatively easier or less expensive to form as compared to the lower conductive film 36. Furthermore, the bulk conductive film 38 and the lower conductive film 36 can have different compositions, so that either film can be removed selectively to the other film. The bulk conductive film 38 can include doped silicon, such as $N^+$ doped polysilicon. After depositing the bulk conductive film 38, it is recessed to reduce the gate-to-source capacitance. Exposed portions of the lower conductive film 36 are removed so that the lower conductive film 36 does not overlie the active structures 22 and to reduce gate-to-source capacitance. In another embodiment, the gate electrode includes a single film as opposed to more than one film, for example, W. After reading this specification, skilled artisans will understand that other materials and other numbers of films can be used for the gate electrode.

Figure 4:
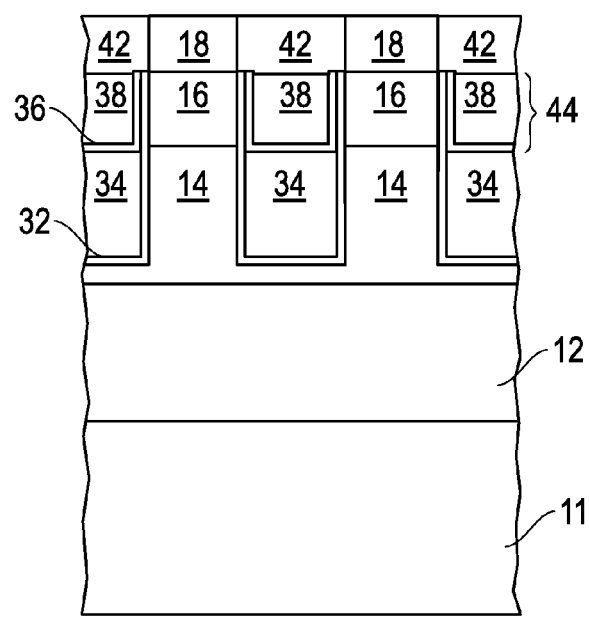
FIG. 4 includes an illustration of a cross-sectional view of the substrate of FIG. 3 after forming an insulating layer between portions of the active structures.

In FIG. 4, an insulating layer 42 is formed over the gate electrode and fills a remaining portion of the openings 24. The insulating layer 42 helps to protect the gate electrode when the sacrificial layer 34 is subsequently removed. The insulating layer 42 can include an oxide, a nitride, an oxynitride or any combination thereof. In an embodiment, the insulating layer 42 is formed within the openings 24 and over the active structures 22. A portion of the insulating layer 42 that lies at elevations higher than a top surface of the heavily-doped layer 18 is removed by a chemical-mechanical polishing, an etchback technique, or the like.

Figure 5:
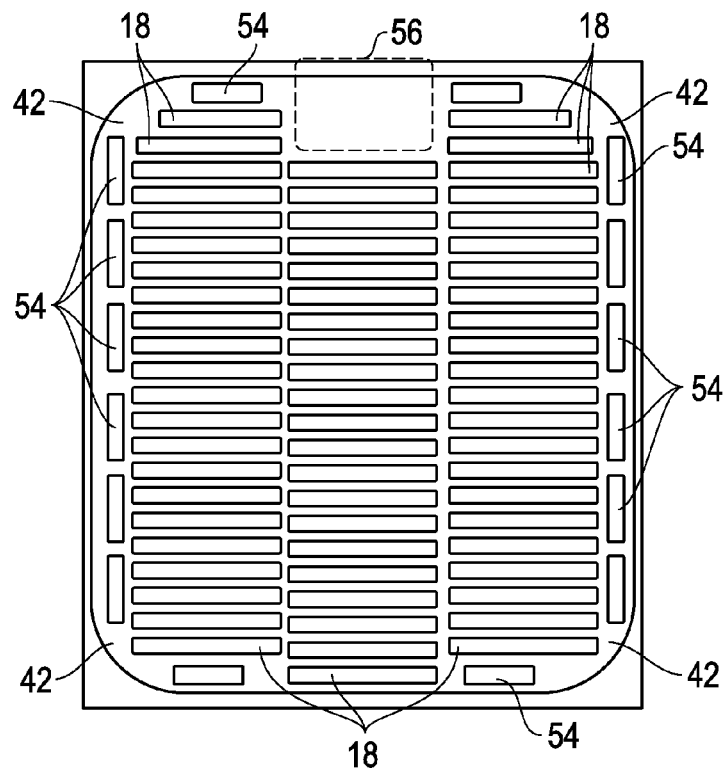
FIG. 5 includes an illustration of a top view of the substrate of FIG. 4 after patterning some of the layers to form openings to the sacrificial layer.

In FIG. 5, openings 54 are formed where the sacrificial layer 34 (not illustrated in FIG. 5) will be exposed. The top surface of the electronic device includes the heavily-doped layer 18, and portions of the insulating layer 42 within the openings. Along the periphery, portions of the insulating layer 42, the bulk conductive film 38, and lower conductive film 36 are removed to expose portions of the sacrificial layer 34 within the openings 54. An isotropic etchant is used to remove the sacrificial layer 34. The etching can be performed as dry etching or wet etching. An exemplary etchant includes KOH, NaOH, $HNO_3$ and HF, $CF_4$, or the like. In an embodiment, both the sacrificial layer 34 and the bulk conductivity film 38 include polysilicon. The bulk conduction film 38 is protected by the lower conductive film 36 and the insulating layer 42 at locations spaced apart from the openings 54. Region 56 represents a location where a subsequent gate contact will be made. In an alternative embodiment, the openings 54 can be formed and etched until the sacrificial layer 34 is exposed, and a spacer (not illustrated) can be formed along the sidewall of the opening to protect the gate electrode during the subsequent etch to remove the remainder of the sacrificial layer 34.

Figure 6:
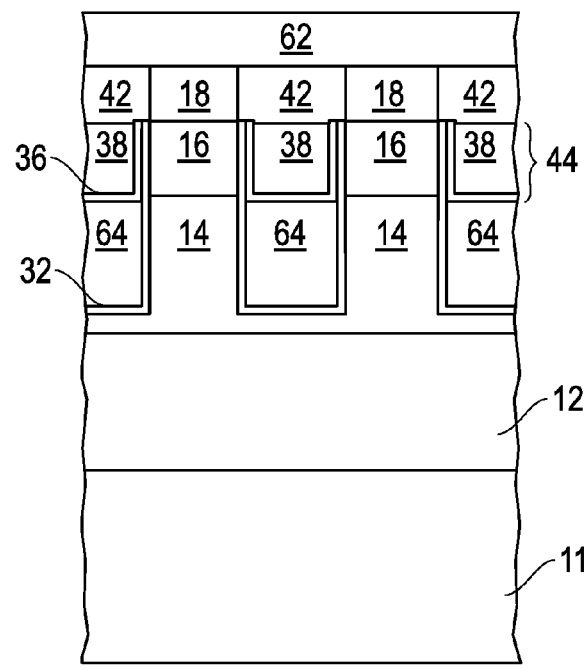
FIGS. 6 and 7 include illustrations of a cross-sectional view and a top view, respectively, of the substrate of FIG. 5 after removing the sacrificial layer to define cavities and after forming source and gate pads.
Figure 7:
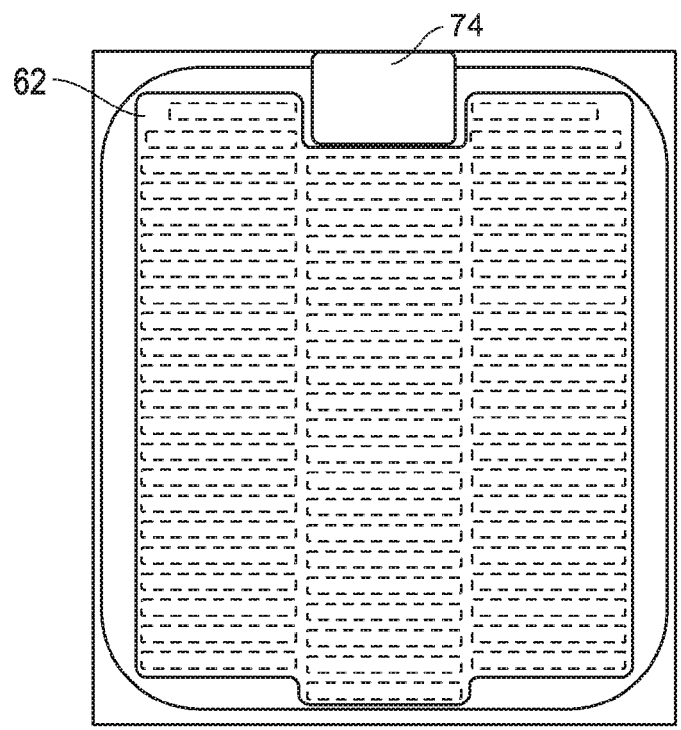

After the sacrificial layer 34 is removed, cavities 64 are formed under the gate electrode 44, as illustrated in FIG. 6. Another insulating layer (not illustrated in FIG. 6) is formed to seal the openings 54 (FIG. 5), so that subsequent materials do not enter locations where the sacrificial layer 34 has been removed and to prevent any possible electrical shorting or leakage between any combination of the source region, gate electrode, and drain region of the transistor. Portions of the other insulating layer overlying the heavily-doped layer 18 are removed and metallization is formed for the source pad 62, as illustrated in FIGS. 6 and 7, and the gate pad 74 in FIG. 7. Portions of the heavily-doped layer 18 that were illustrated in FIG. 5 are covered by the source pad 62, and such portions are illustrated with dashed lines in FIG. 7. The metallization can be a conductive layer that can include a conductive film and may further include an adhesion film, a barrier film, an antireflective film, or any combination thereof. The conductive film can be mostly Al, Cu, or the like, the adhesion film can include Ti, Ta, or the like, the barrier film can include TiN, TaN, TiW, or the like, and the antireflective layer can include TiN.

Figure 8:
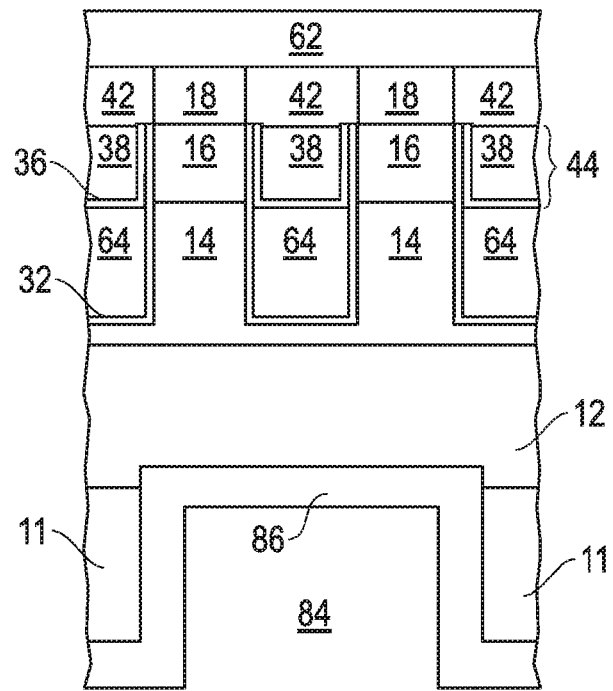
FIG. 8 includes an illustration of a cross-sectional view of the substrate of FIGS. 6 and 7 after patterning the base material and forming a drain pad.

A backside contact to the heavily-doped layer 12 can be made as illustrated in FIG. 8. A protective layer (not illustrated) may be formed over the source pad 62 and the gate pad 74, and the workpiece can be inverted (as compared to the illustration in FIG. 8). A patterned masking layer can be formed over the base material 11, wherein one or more openings in the patterned masking layer expose corresponding one or more portions of the base material 11. For simplicity, the remainder of the description will address the opening in FIG. 8, although one or more other openings may be present and are not illustrated in FIG. 8. The base material 11 under the opening is removed to expose the heavily-doped layer 12, and the patterned masking layer is removed. Metallization 86 is formed that extends into the opening through the base material 11 and contacts the heavily-doped layer 12, as illustrated in FIG. 8. The metallization 86 can be a drain terminal or electrically connected to a drain terminal for the transistor. The metallization 86 can be any of the compositions as previously described with respect to the source pad 62 and the gate pad 74. The metallization 86 may have the same or different composition as compared to the source pad 62 and gate pad 74.

An anneal operation can be performed to sinter the contacts and form ohmic contacts 1 between the source pad 62 and the heavily-doped layer 18, the gate pad 74 and the gate electrode, and the metallization 86 and the heavily-doped layer 12. In another embodiment, the anneal operation may be performed once after forming the source pad 62 and the gate pad 74 and before forming the metallization 86, or may be performed after forming the source pad 62 and the gate pad 74 and again after forming the metallization 86. In a particular embodiment, the anneal operation may be performed in a rapid thermal anneal at a temperature in a range of 500° C. to 700° C. for a time in a range from 0.3 minute to 5 minutes. The ambient during anneal can include an inert gas, such as Ar or another noble gas, a reducing gas, such as $H_2$, or any mixture thereof.

Although not illustrated, additional or fewer layers or features may be used as needed or desired to form the electronic device. In another embodiment, one or more insulating and interconnect levels may be used. A passivation layer can be formed over the workpiece or within the interconnect levels. In still another embodiment, the base material 11 may not be present, and the heavily-doped layer 12 has a sufficient thickness to provide adequate mechanical support. In this embodiment, the patterning as described with respect to FIG. 8 would not be needed. The metallization 86 can directly contact the heavily-doped layer 12. After reading this specification, skilled artisans will be able to determine layers and features needed or desired for their particular application.

The embodiments as described can used to form an electronic device that has a vertical III-V transistor. The vertical orientation helps to make metallization easier as compared to a planar device and helps to reduce capacitive coupling between the source and drain and between the gate and drain, as drain contacts do not need to be on the same side of the die as the source and gate contacts. Furthermore, in a particular embodiment in which cavities are formed, capacitive coupling between the gate and drain is reduced. Accordingly, the figure of merit ($R_{DSON}*Q_G$) can be lowered.

In an embodiment, the vertical transistor can have a gate electrode that laterally surrounds channel regions when the channel regions are parts of mesas or along opposite sides of the channel regions when the channel regions are in the form of stripes. Such a configuration can allow for very good control of the electrical field within the channel regions. In a particular embodiment, the transistor has a semiconductor composition of GaN and the same conductivity type for source, drain, and channel regions. When the active structure 22 has a width of no greater than 300 nm, the ratio of on-current to off-current can be greater than $1\times10^7$. When the active structures have a width of less than 200 nm, such as 100 nm, the transistor can be an enhancement-mode transistor. In another particular embodiment, wherein the channel region has an opposite conductivity type as compared to the drain region and the source region, the ratio of on-current to off-current may be different, and the width of the active structures may be increased and still obtain an enhancement-mode transistor. The transistor can have a threshold voltage greater than +0.2 V, +0.4 V, and higher, such as +0.5 V, or even higher.

The transistor can support a voltage difference between the source and the drain of over 50 V, over 100 V, over 500 V, or higher. When designed for a 600 V difference between the source and drain, $R_{DSON}$ can be less than 100 microohm*cm$^2$ or less than 50 microohm*cm$^2$. In a particular embodiment, $R_{DSON}$ can be approximately 30 microohm*cm$^2$. The figure of merit can be less than 9000 nC*milliohms, less than 5000 nC*milliohms, or less than 2000 nC*milliohms. In a particular embodiment, the figure of merit can be approximately 1280 nC*milliohms.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device comprising a vertical III-V transistor having a gate electrode and a channel region within a homostructure, wherein the channel region is disposed between a first portion and a second portion of the gate electrode.

Item 2. The electronic device of Item 1, wherein the vertical III-V transistor is an enhancement-mode transistor.

Item 3. The electronic device of Item 2, wherein the vertical III-V transistor further comprises a heavily-doped drain region and a source region, wherein the channel region is disposed between the heavily-doped drain and source region, and wherein the heavily-doped drain region, source region, and the channel region have a same conductivity type.

Item 4. The electronic device of Item 3, wherein the same conductivity type is an n-type conductivity.

Item 5. The electronic device of Item 3, wherein the same conductivity type is a p-type conductivity.

Item 6. The electronic device of Item 3, wherein the vertical III-V transistor further comprises a voltage blocking layer between the channel region and the heavily-doped drain region.

Item 7. The electronic device of Item 6, wherein the voltage blocking layer is disposed between a first portion and a second portion of a cavity.

Item 8. The electronic device of Item 3, wherein the gate electrode surrounds portions of the source region and the voltage blocking layer, and does not surround any part of the heavily-doped drain region.

Item 9. The electronic device of Item 1, wherein the III-V transistor comprises a semiconductor material have a bandgap energy of at least 2 eV.

Item 10. The electronic device of Item 1, wherein the III-V transistor is a GaN transistor.

Item 11. The electronic device of Item 10, wherein the GaN transistor further comprises a source region; a voltage blocking layer; and a heavily-doped drain region, wherein:
the source region, the channel region, the voltage blocking layer, and the heavily-doped drain region have a same conductivity type;

the channel region is disposed between the source region and the voltage blocking layer and has a dopant concentration no greater than $1 \times 10^{15}$ atoms/cm$^3$;

the voltage blocking layer is disposed between the channel region and the heavily-doped drain region and has a dopant concentration in a range of $5 \times 10^{16}$ atoms/cm$^3$ to $5 \times 10^{18}$ atoms/cm$^3$; and a cavity is disposed between the gate electrode and the heavily-doped drain region and lies adjacent to the voltage blocking layer.

Item 12. A process of forming an electronic device comprising:

forming a patterned homostructure including a first heavily-doped layer, a channel layer, and a second heavily-doped layer, wherein a first opening extends through all of a thickness of each of the second heavily-doped layer and the channel layer;

forming a gate electrode within the first opening, wherein a channel region is disposed between a first portion and a second portion of the gate electrode, wherein the first heavily-doped layer, the channel layer, the second heavily-doped layer, and the gate electrode are parts of a vertical III-V transistor.

Item 13. The process of Item 12, wherein forming the gate electrode comprises forming a gate electrode layer within the first opening and etching a portion of the gate electrode layer to recess the gate electrode within the opening.

Item 14. The process of Item 13, wherein forming the gate electrode layer comprises forming a first conductive film of the gate electrode, and forming a second conductive film that is a bulk conductive film for the gate electrode, wherein the first and second conductive films have different compositions.

Item 15. The process of Item 12, further comprising providing a substrate that includes the first heavily-doped layer, a voltage blocking layer, the channel layer, and the second heavily-doped layer, wherein the voltage blocking layer is disposed between the first heavily-doped layer and the channel layer, and the channel layer is disposed between the voltage blocking layer and the second heavily-doped layer.

Item 16. The process of Item 15, wherein the first opening extends through at least most of the voltage blocking layer.

Item 17. The process of Item 15, further comprising forming a sacrificial layer within the first opening before forming the gate electrode; and removing the sacrificial layer from the first opening after forming the gate electrode to define a cavity adjacent to the voltage blocking layer.

Item 18. The process of Item 12, wherein the first heavily-doped layer, the channel layer, and the second heavily-doped layer have a same conductivity type.

Item 19. The process of Item 18, wherein the vertical III-V transistor is an enhancement-mode transistor.

Item 20. The process of Item 12, further comprising:

providing a substrate that includes a base material, the first heavily-doped layer, the channel layer, and the second heavily-doped layer, wherein the channel layer is disposed between the voltage blocking layer and the second heavily-doped layer; and patterning the base material to define a second opening that expose a portion of the first heavily-doped layer; and forming a conductive layer with within the second opening and contacting the first heavily-doped layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a vertical III-V transistor comprising:
   a gate electrode;
   a heavily-doped drain region;
   a voltage blocking layer; and
   a channel region within a homostructure,
   wherein:
      the channel region is disposed between a first portion and a second portion of the gate electrode; and
      the voltage blocking layer is disposed between the channel region and the heavily-doped drain region.

2. The electronic device of claim 1, wherein the vertical III-V transistor further comprises a cavity is disposed between the gate electrode and the heavily-doped drain region and lies adjacent to the voltage blocking layer.

3. The electronic device of claim 1, wherein the voltage blocking layer is disposed between a first portion and a second portion of a cavity.

4. The electronic device of claim 1, wherein the gate electrode surrounds portions of the source region and the voltage blocking layer, and does not surround any part of the heavily-doped drain region.

5. The electronic device of claim 1, wherein the gate electrode includes a lower conductive film and a bulk conductive film, wherein the lower conductive film laterally surrounds and underlies the bulk conductive film.

6. The electronic device of claim 1, wherein the III-V transistor is a GaN transistor.

7. The electronic device of claim 6, wherein the GaN transistor further comprises a source region, wherein:
   the source region, the channel region, the voltage blocking layer, and the heavily-doped drain region have a same conductivity type;
   the channel region is disposed between the source region and the voltage blocking layer and has a dopant concentration no greater than $1 \times 10^{15}$ atoms/cm$^3$;

the voltage blocking layer has a dopant concentration in a range of $5\times10^{16}$ atoms/cm$^3$ to $5\times10^{18}$ atoms/cm$^3$.

8. The electronic device of claim 1, wherein the vertical III-V transistor is an enhancement-mode transistor.

9. The electronic device of claim 8, wherein the vertical III-V transistor further comprises a source region, wherein the channel region is disposed between the heavily-doped drain and source region, and wherein the heavily-doped drain region, source region, and the channel region have a same conductivity type.

10. The electronic device of claim 9, wherein the same conductivity type is an n-type conductivity.

11. The electronic device of claim 9, wherein the same conductivity type is a p-type conductivity.

12. A process of forming an electronic device comprising:
forming a patterned homostructure including a first heavily-doped layer, a channel layer, and a second heavily-doped layer, wherein a first opening extends through all of a thickness of each of the second heavily-doped layer and the channel layer;
forming a gate electrode layer within the first opening; and
etching a portion of the gate electrode layer to form and recess a gate electrode within the first opening, wherein a channel region is disposed between a first portion and a second portion of the gate electrode,
wherein the first heavily-doped layer, the channel layer, the second heavily-doped layer, and the gate electrode are parts of a vertical III-V transistor.

13. The process of claim 12, wherein forming the gate electrode layer comprises:
forming a first conductive film of the gate electrode; and
forming a second conductive film that is a bulk conductive film for the gate electrode, wherein the first and second conductive films have different compositions.

14. The process of claim 12, further comprising:
providing a substrate that includes a base material, the first heavily-doped layer, the channel layer, a voltage blocking layer, and the second heavily-doped layer, wherein the channel layer is disposed between the voltage blocking layer and the second heavily-doped layer;
patterning the base material to define a second opening that expose a portion of the first heavily-doped layer; and
forming a conductive layer with within the second opening and contacting the first heavily-doped layer.

15. The process of claim 12, wherein the first heavily-doped layer, the channel layer, and the second heavily-doped layer have a same conductivity type.

16. The process of claim 15, wherein the vertical III-V transistor is an enhancement-mode transistor.

17. The process of claim 12, further comprising providing a substrate that includes the first heavily-doped layer, a voltage blocking layer, the channel layer, and the second heavily-doped layer, wherein the voltage blocking layer is disposed between the first heavily-doped layer and the channel layer, and the channel layer is disposed between the voltage blocking layer and the second heavily-doped layer.

18. The process of claim 17, wherein the first opening extends through at least most of the voltage blocking layer.

19. The process of claim 17, further comprising:
forming a sacrificial layer within the first opening before forming the gate electrode; and
removing the sacrificial layer from the first opening after forming the gate electrode to define a cavity adjacent to the voltage blocking layer.

* * * * *